United States Patent
Nara

(10) Patent No.: US 7,315,731 B2
(45) Date of Patent: Jan. 1, 2008

(54) METHOD OF MEASURING AND CALIBRATING FREQUENCY DOWN CONVERTER

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 606 days.

(21) Appl. No.: 10/987,281

(22) Filed: Nov. 12, 2004

(65) Prior Publication Data

US 2005/0118970 A1    Jun. 2, 2005

(30) Foreign Application Priority Data

Nov. 28, 2003 (JP) .............................. 2003-400526

(51) Int. Cl.
*H04B 17/00* (2006.01)
(52) U.S. Cl. ................... 455/226.1; 455/260; 455/339; 342/174; 375/356
(58) Field of Classification Search ............... 455/131, 455/146, 147, 200.1, 205, 207, 226.1, 226.2, 455/313, 339, 340, 341, 150.1, 161.1–161.3, 455/255–260; 342/174; 375/355, 356
See application file for complete search history.

(56) References Cited

U.S. PATENT DOCUMENTS

| | | | |
|---|---|---|---|
| 5,507,015 A | * | 4/1996 | Karczewski et al. ........ 455/116 |
| 5,847,613 A | * | 12/1998 | Langlet et al. ................. 331/3 |
| 6,377,640 B2 | * | 4/2002 | Trans .......................... 375/354 |
| 6,658,075 B1 | * | 12/2003 | Aftelak ....................... 375/375 |
| 6,670,913 B1 | * | 12/2003 | Talbot et al. .......... 342/357.06 |

* cited by examiner

*Primary Examiner*—Edward F. Urban
*Assistant Examiner*—Nhan T. Le
(74) *Attorney, Agent, or Firm*—Francis I. Gray

(57) ABSTRACT

A frequency down converter that maintains accuracy even if the frequency pass band is wide uses a reference frequency band within the frequency pass band, the reference frequency band being resistant to degradation by aging or temperature variation. The ideal characteristics of the reference frequency band are previously stored. The frequency down converter has a calibration signal source that inputs a calibration signal to the frequency down converter to measure the characteristics of the reference frequency band and to store differences from the ideal characteristics. The calibration signal is input to obtain the characteristic data of other frequency bands within the frequency pass band, and the characteristic data are revised by the above differences. Then compensation coefficients to compensate the revised characteristic data into the ideal characteristics are calculated. The frequency down converter uses the compensation coefficients to compensate the frequency domain data, which maintains the accuracy over the wide frequency pass band.

9 Claims, 4 Drawing Sheets

METHOD OF MEASURING AND CALIBRATING FREQUENCY DOWN CONVERTER

BACKGROUND OF THE INVENTION

The present invention relates to frequency conversion, and more particularly to a method of measuring and calibrating a frequency down converter to maintain accuracy over a wide frequency band.

A frequency down converter in a receiver converts a high frequency communication signal, such as a radio frequency (RF) signal from wireless communication instruments, i.e., mobile phones, to an intermediate frequency (IF). The down-converted IF signal is filtered and demodulated to retrieve useful information from the RF signal. A spectrum analyzer also uses the frequency down converter to make measurements of the RF signal. An IF filter is used to extract a desired frequency band from the IF signal.

The frequency conversion process in mobile phones is relatively crude, and is only necessary to retrieve the useful information even if the RF signal has been distorted. However, the spectrum analyzer has to be able to measure how much the RF signal has been distorted. Therefore, the frequency characteristics of the frequency down converter in the spectrum analyzer must be extremely good.

As telecommunication systems improve from one generation to the next, changes in mobile phones require that the spectrum analyzer be able to measure a wider frequency band at one time than was necessary previously. This then requires a wide IF bandwidth in the frequency down converter of the spectrum analyzer. Frequency-versus-amplitude and group delay characteristics have to be good if the IF signal from the frequency down converter is used for measuring characteristics of the RF signal.

The IF filter substantially defines the characteristics of the IF bandwidth. It is difficult to make the frequency characteristics of a frequency pass band in the IF filter completely flat using only hardware adjustment. Therefore, software adjustment also is used to make the frequency pass band flat. The IF frequency characteristics are measured by some means when the frequency down converter is manufactured or periodically calibrated, and coefficients for compensating the frequency characteristics are calculated for the software adjustment.

Degradation of the IF frequency characteristics due to aging of parts or temperature variation becomes more noticeable farther from the center of the frequency pass band so that a wider frequency pass band than actually needed is used so the characteristic variation due to aging or temperature variation may be ignored. However, it is disadvantageous to make the bandwidth wider since the available bandwidth is narrower than the total bandwidth.

One conventional method for realizing a wide bandwidth is to provide a spectrum analyzer with a calibration signal source whose frequency characteristic is known. The spectrum analyzer is calibrated periodically by the output of the calibration signal source. However, it is very difficult to maintain the accuracy of the calibration signal source over a wide frequency band. For example, if an amplifier is used to increase the S/N ratio of the calibration signal source, the variation of the amplifier characteristics should be very small.

U.S. Pat. No. 6,356,067 (Akira Nara) discloses an apparatus for analyzing wideband frequencies which has two signal processing paths—a narrow and a wide frequency pass band. The wide frequency pass band is used for a process, such as trigger event detection, that requires a wide frequency pass band even if the frequency characteristic is not very good, and the narrow frequency pass band measures the signal satisfying the trigger condition detected by the wide frequency pass band having good frequency characteristics. This provides a virtual wide frequency pass band of good frequency characteristics for the measurement. However, it cannot measure every portion of the wide frequency pass band with good frequency characteristics at the same time.

As described, it is difficult to secure good frequency characteristics over the whole frequency pass band, even though some approaches have been tried to make the frequency pass band of the frequency down converter wider. Even if the calibration signal source is used to generate a calibration signal for periodically calibrating the frequency down converter, the calibration signal source itself cannot provide the calibration signal with frequency characteristics that are always constant, and there is a problem as the frequency characteristics vary with age.

Therefore what is desired is to provide a method for calibrating a frequency down converter to secure good frequency characteristics for a wider frequency pass band than needed before in the presence of aging and temperature variation.

SUMMARY OF THE INVENTION

Accordingly, the present invention provides a method of calculating compensation coefficients that are applicable to a wide frequency pass band in the presence of aging and temperature variations, and a method of measuring characteristics of the frequency pass band of a frequency down converter that are necessary for calibration. These methods are mainly performed by software so that additional hardware is kept to a minimum. A particular portion in the frequency pass band of the frequency down converter is relatively resistant to degradation by aging or temperature variation. The ideal characteristics of the particular portion, or reference frequency band, are stored by previous measurements. A calibration signal is input to the frequency down converter to measure the characteristics of the reference frequency band in order to store differences from the ideal characteristics, the differences being deemed mainly to be due to errors in the calibration signal. The calibration signal is input to frequency bands within the frequency pass band of the frequency down converter, other than the reference frequency band, to measure characteristics for the frequency bands that are revised according to the differences previously measured. The revised characteristics have values that are free from aging and temperature variations and provide the ideal characteristics for the frequency down converter, i.e., compensation coefficients for revising the characteristics are determined by the differences from the ideal characteristics. These compensation coefficients are used during usual frequency down conversions to revise the whole frequency pass band to have the ideal characteristics.

Alternatively, the calibration signal itself may be revised to obtain the ideal characteristics from the reference frequency band. Then the revised calibration signal is provided to the frequency down converter to measure characteristics of frequency bands within the wide frequency pass band other than the reference band, and the resultant characteristics are used to generate compensation data to revise the frequency bands to have the ideal characteristics.

If the bandwidth of the calibration signal is wider, it may calibrate a wider frequency band. However, it is necessary to have at least a bandwidth that is wider than that of the reference frequency band. It is better that the reference frequency band maintains its accuracy for a long time than that it have a wide bandwidth. If the calibration signal does not have enough bandwidth to calibrate the entire frequency pass band of the frequency down converter at one time, the center frequency of the frequency down converter is changed sequentially to provide the calibration signals to the frequency down converter to measure the characteristics of the frequency bands other than the reference frequency band. The compensation coefficients are derived from the resultant characteristics and the ideal characteristic data.

The reference frequency band is usually a central frequency band in the frequency pass band because it is relatively resistant to aging or temperature variation. However, if the frequency pass band is determined by a plurality of frequency down converters, the reference frequency band may not be the central portion of the frequency pass band. For example, U.S. patent application Ser. No. 10/855,040 (Akira Nara), filed on May 26, 2004 corresponding to Japanese Patent Application No. 2003-270247, discloses that the frequency pass band is created by a plurality of frequency down converters. How much bandwidth in the frequency pass band is used as the reference frequency band may be properly determined according to resistance to aging or temperature variation, or convenience of calibration signal processing.

The objects, advantages and other novel features of the present invention are apparent from the following detailed description when read in conjunction with the appended claims and attached drawings.

DETAILED DESCRIPTION OF THE INVENTION

Figure 1:
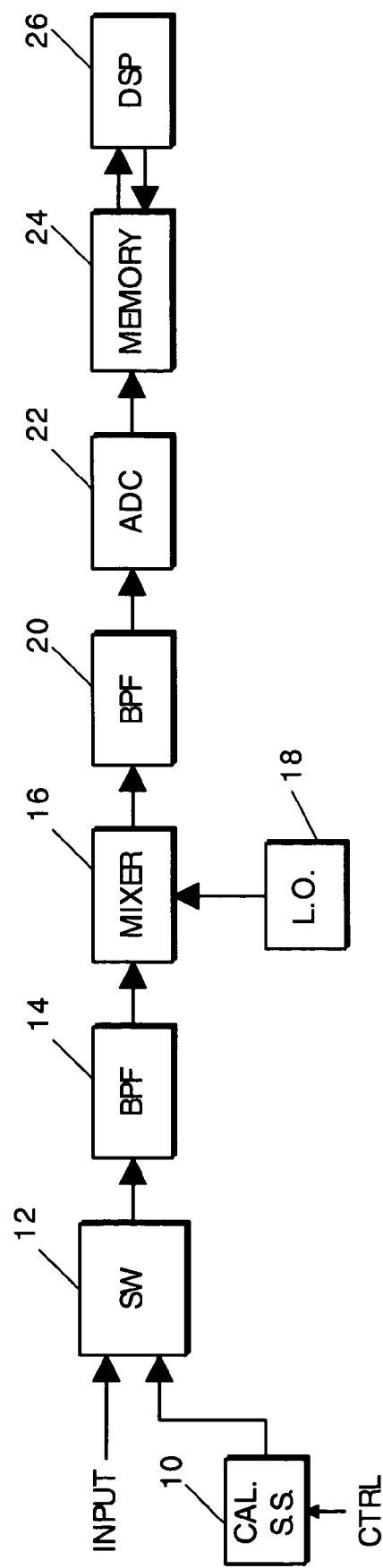
FIG. 1 is a block diagram view of a frequency down converter according to the present invention.

FIG. 1 shows a frequency down converter that usually uses a plurality of mixers, but a single mixer is shown for illustration. The frequency down converter is coupled to a controller (not shown) having a microprocessor, a hard disk drive, a keyboard, etc., as is well known as personal computer architecture to one of ordinary skill in the art, and is controlled according to a program stored in a storage device, such as the hard disk drive. A calibration signal source 10 generates a calibration signal having a flat bandwidth frequency characteristic which is controlled according to a control signal from the controller. A switch 12 selectively provides an RF input signal or the calibration signal for input to the frequency down converter. A band pass filter (BPF) 14 limits the input frequencies to a desired frequency range or bandwidth. A mixer 16 mixes the input signal and a signal from a local oscillator 18 to provide an output signal having the sum and difference frequencies. A BPF 20 selects one of the sum and difference frequencies as the IF frequencies output from the mixer 16. The frequency of the signal from the local oscillator 18 is nominally the center frequency of the frequency down converter, and variable according to a desired center frequency setting. An analog to digital converter (ADC) 22 converts the IF signal from the BPF 20 into time domain digital data. The digital data from ADC 22 is stored in a memory 24 and provided to a digital signal processor (DSP) 26.

The DSP 26 converts the time domain digital data into frequency domain digital data using an appropriate transform function, such as a fast Fourier transform (FFT) process. From the frequency domain digital data the frequency characteristics of the output signal of the frequency down converter are determined, such as the flatness of the frequency pass band. The controller determines the flatness from the frequency domain digital data. The frequency domain digital data may be stored in the memory 24 again or in the hard disk drive (not shown).

Figure 2:
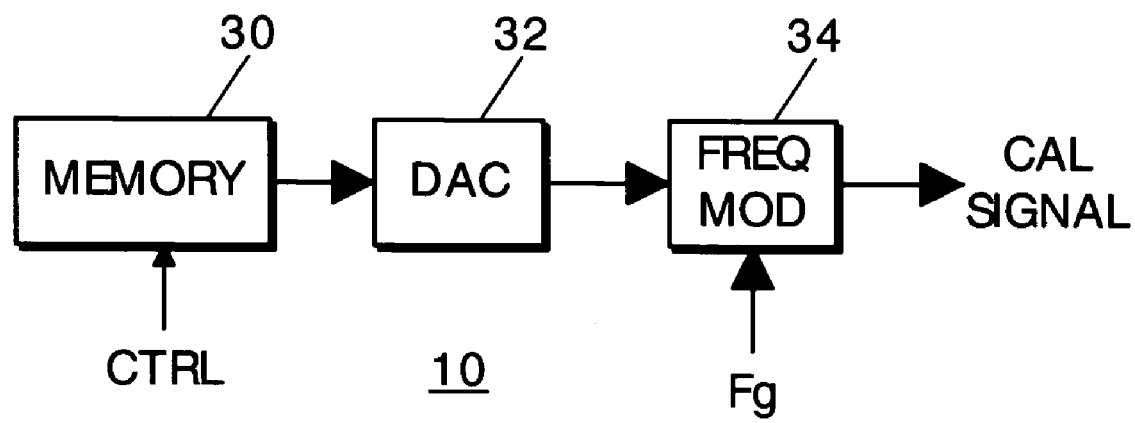
FIG. 2 is a block diagram view of a calibration signal source according to the present invention.

Referring now to FIG. 2, the calibration signal source 10 may provide a calibration signal simulating, for example, the RF signal from a mobile phone. A memory 30 has digital data for the calibration signal that is converted into an analog signal by a digital to analog converter (DAC) 32. The controller can change the data in the memory 30 so that the data corresponds to a desired baseband signal. A frequency modulation circuit 34 receives a signal of a frequency Fg that is used as a carrier frequency, and modulates it by the baseband signal to produce the RF signal. Thus the calibration signal is generated as a signal that has a center frequency Fg and a bandwidth Fm. A set of the frequencies of the calibration signal is selected according to the frequency pass band of the frequency down converter under calibration. Fm is selected to have a bandwidth Fb comparable to that of the reference frequency band, or wider, as described below.

Figure 3:
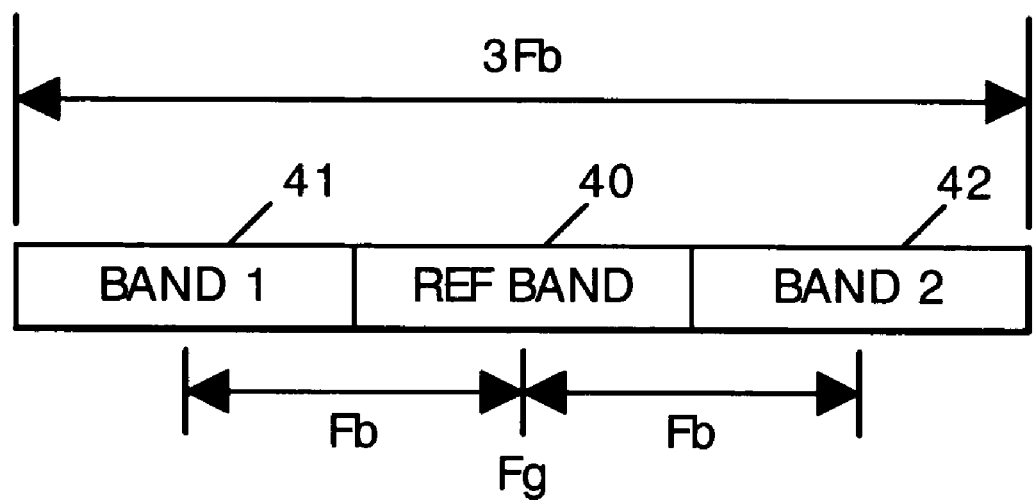
FIG. 3 is a graphic view of the relationship between the frequency pass band of the frequency down converter, and a reference frequency band and other frequency bands under calibration according to the present invention.

FIG. 3 shows a relationship of bandwidths between the IF or frequency pass band of the frequency down converter, the reference frequency band and other frequency bands within the IF band under calibration. For convenience of explanation, the bandwidth of the IF band of the frequency down converter is 3Fb. The bandwidth of the reference frequency band 40 is Fb, and the bandwidths of the first and second frequency bands 41, 42 under calibration are also Fb. The reference frequency band 40 has higher and lower bands of bandwidth Fb/2 with the center frequency Fg, and then the first and second frequency bands have respective centers at the frequencies Fg−Fb and Fg+Fb.

As described above, a center portion in the frequency pass band of the frequency down converter is not significantly affected by degradation due to aging or temperature variation. Therefore the center portion is used as the reference frequency band for the calibration. The bandwidth of the reference frequency band 40 may be selected depending on how much it is affected by aging or temperature variation, or whether it is suitable for signal processing. If the frequency pass band is defined by a plurality of frequency down converters as disclosed in Japanese patent application No. 2003-270247, corresponding to U.S. patent application Ser. No. 10/855,040 (Akira Nara), one of the frequency down converters may be selected and the center portion of the IF band of the selected one may be the reference frequency band, i.e., the reference frequency band is not always the center of the frequency pass band.

Figure 4:
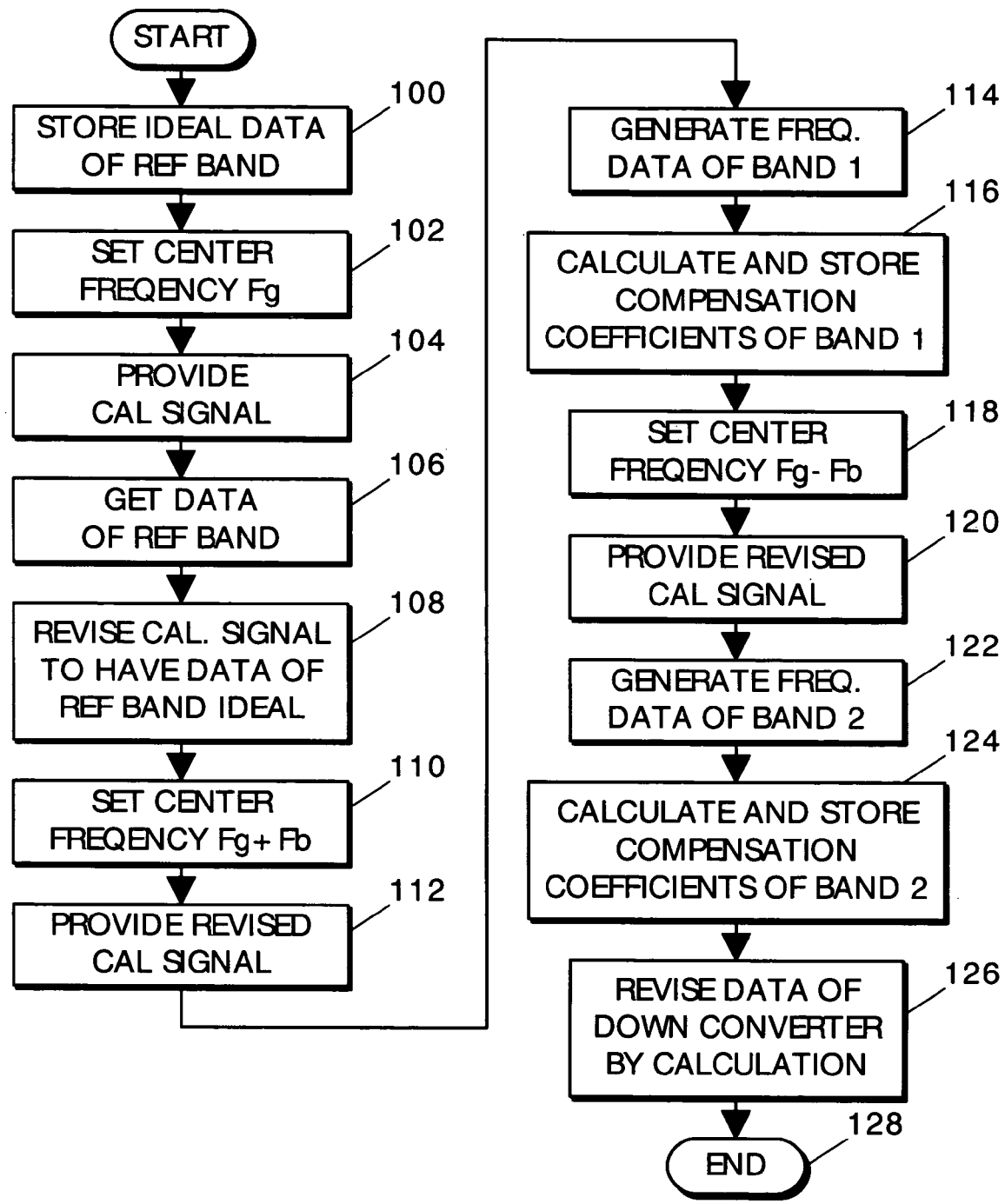
FIG. 4 is a flowchart view of a first embodiment for measuring and calibrating the frequency down converter according to the present invention.

As shown in FIG. 4 the memory 24 or storage device, such as the hard disk drive, stores ideal frequency characteristics for the reference frequency band 40 (step 100). The frequency down converter is adjusted by hardware and by software to have the ideal characteristics, i.e., to make the frequency pass band characteristics flat, at the manufacturer's site during initial calibration. The ideal characteristics are frequency domain data derived from the reference frequency band 40 in this condition.

The center frequency of the frequency down converter is set to Fg by the controller (step 102), and a calibration signal is provided to the frequency down converter (step 104). As described above, the calibration signal has the center frequency Fg and the bandwidth Fm so that the frequency domain data generation by the DSP 26 using the frequency conversion process according to this setting provides output frequencies including the reference frequency band 40 to generate the characteristics of the reference frequency band 40 (step 106). If the frequency domain data generated by the DSP 26 is different from the ideal characteristics, the characteristics of the calibration signal are deemed to be distorted as opposed to the reference frequency band 40. Therefore, the controller rewrites the data in the calibration signal source 10 to revise the calibration signal to generate the ideal characteristics, or frequency domain data, (step 108) from the reference frequency band.

In step 110, the controllers sets the center frequency of the frequency down converter Fg–Fb, i.e., the frequency of the local oscillator 18 is set to be Fg–Fb. After this, the calibration signal as revised in step 108 is input to the frequency down converter (step 112). Then, the frequency down converter provides output frequencies of bandwidth Fm for the first band 41. The resulting time domain data is processed by the DSP 26 to generate frequency domain data for the first frequency band 41 (step 114). The controller calculates differences between the frequency characteristics for the first frequency band 41 and the ideal characteristics, which are stored in the memory 24 or the hard disk drive as compensation coefficients for the first frequency band 41 (step 116). Specifically, amplitude ratios between the frequency characteristics and the corresponding ideal characteristics are the compensation coefficients or compensation data.

The controller then sets up the center frequency of the frequency down converter as Fg+Fb and changes the oscillation frequency of the local oscillator 18 to Fg+Fb (step 118). The revised calibration signal is input to the frequency down converter (step 120). The frequency down converter provides the frequencies of bandwidth Fm for the second frequency band 42, and the DSP 26 generates the frequency domain data for the second frequency band 42 (step 122). The memory 24 stores differences between the frequency characteristics, as indicated by the frequency domain data for the second frequency band 42, and the ideal characteristics as the compensation coefficients (step 124).

The compensation coefficients generated in the calibration process are used during an actual frequency conversion process to revise the acquired frequency domain data (step 126). This makes a precision frequency conversion possible even for a wide frequency pass band. However, if the hardware is getting so bad that it is not possible to recover the accuracy by calculation compensation, the controller determines whether the differences between the frequency characteristics and the ideal characteristics are too much, or the compensation coefficients are above a predetermined threshold, then the controller may be programmed to alert a user that hardware calibration is necessary. In this case, step 126 is not executed and just the characteristic measurement of the frequency band is performed.

Figure 5:
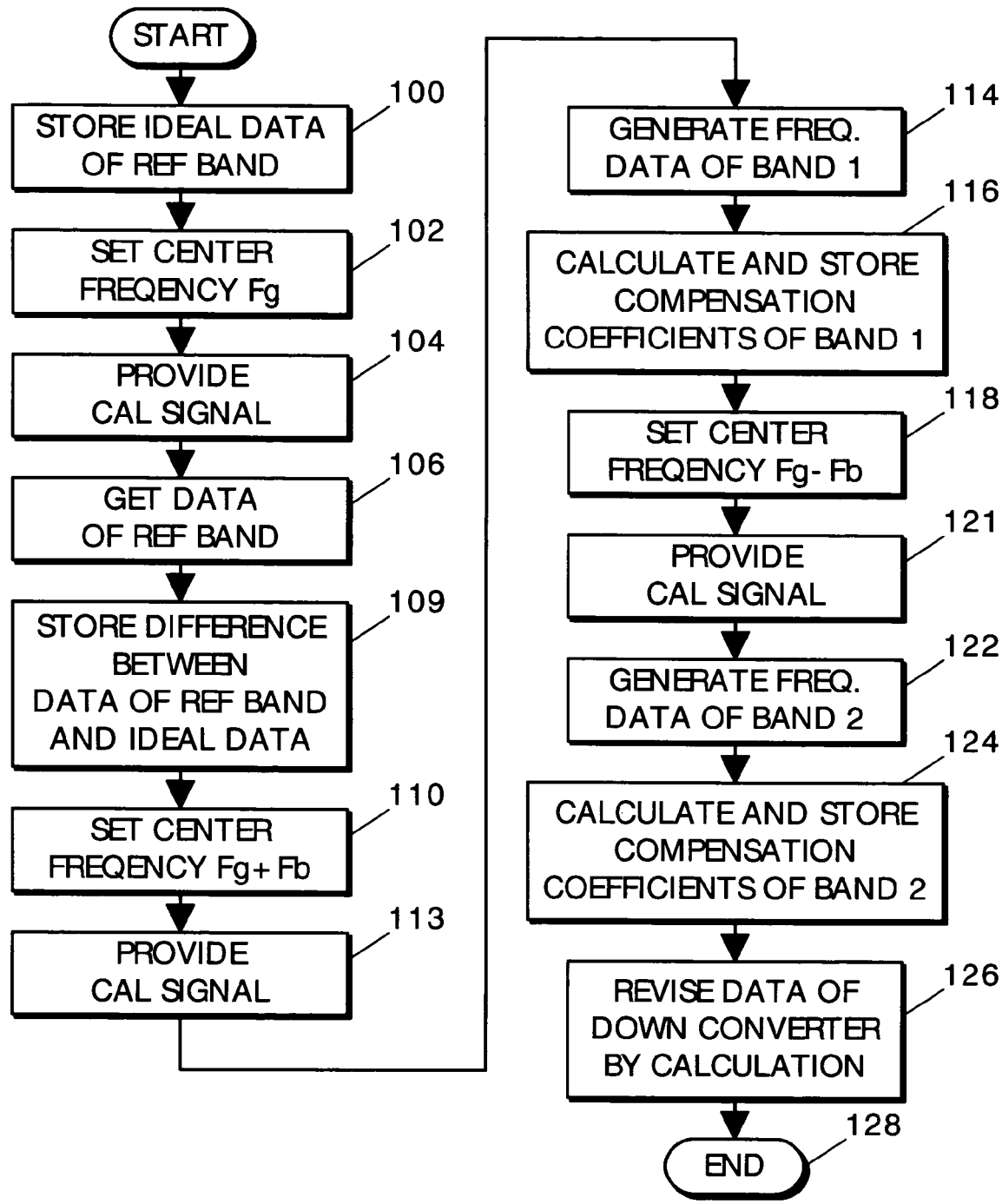
FIG. 5 is a flowchart view of a second embodiment for measuring and calibrating the frequency down converter according to the present invention.

In FIG. 4 the calibration signal is revised in step 108, but as shown in FIG. 5 it is not revised in the second embodiment. Therefore, the calibration signals provided for measuring the first and second frequency band characteristics are not revised as shown in steps 113 and 121. Instead of that, differences between the ideal characteristics and the characteristics of the reference frequency band are stored in step 109 when the calibration signal is provided. The differences are derived from the deviation of the frequency characteristics from the ideal characteristics so that the calculations in steps 116 and 124 revise the frequency characteristics of the respective frequency bands according to the differences, and compensation coefficients are calculated to make the revised frequency characteristics the same as the ideal characteristics.

The above embodiments are described based on the illustration of dividing the frequency band into three bands, but it is similar if the frequency band is divided into four or more bands. If the number of the bands is increased, a wider frequency pass band may be calibrated. The frequency down converter described above may be used in any apparatus that requires a wide frequency pass band and high precision. A spectrum analyzer is just one such apparatus, but it is not limited to this.

Thus the present invention provides a method of calibrating and measuring the characteristics of a wide frequency pass band for a frequency down converter by comparing measured characteristics for a reference frequency band within the frequency pass band with stored ideal characteristics in response to a known calibration signal, and either adjusting the calibration signal or adjusting compensation coefficients to produce the ideal characteristics at the output of the frequency down converter.

What is claimed is:

1. A method of measuring characteristics of a frequency down converter comprising the steps of:
    storing ideal characteristics of a reference frequency band within a frequency pass band of the frequency down converter;
    inputting a calibration signal to the frequency down converter to measure characteristics of the reference frequency band;
    storing difference data between the measured and ideal characteristics of the reference frequency band;
    inputting the calibration signal to frequency bands within the frequency pass band other than the reference frequency band to measure characteristics of the frequency bands; and
    revising the measured characteristics of the frequency bands using the difference data.

2. The method as recited in claim 1 further comprising the step of measuring the ideal characteristics when the frequency down converter is initially calibrated.

3. The method as recited in claim 1 further comprising the step of converting measurements of the calibration signal into the frequency domain as the characteristic data of the reference frequency and frequency bands.

4. The method as recited in claim 1 wherein the inputting of the calibration signal to the frequency bands comprises the step of changing the center frequency of the frequency down converter.

5. A method of calibrating a frequency down converter comprising the steps of:
- storing ideal characteristics of a reference frequency band within a frequency pass band of the frequency down converter;
- inputting a calibration signal to the frequency down converter to measure characteristics of the reference frequency band;
- storing differences between the ideal and measured characteristics; and
- inputting the calibration signal to frequency bands within the frequency pass band other than the reference frequency band to measure characteristics of the frequency bands; and
- generating compensation data for converting the measured characteristics of the frequency bands as revised by the differences into the ideal characteristics.

6. A method of calibrating a frequency down converter comprising the steps of:
- storing ideal characteristics of a reference frequency band within a frequency pass band of the frequency down converter;
- inputting a calibration signal to the frequency down converter to measure characteristics of the reference frequency band;
- revising the calibration signal to change the measured characteristics to be the ideal characteristics for the reference frequency band;
- inputting the revised calibration signal to the frequency down converter to measure characteristics of frequency bands within the frequency pass band other than the reference band; and
- generating compensation data to change measured characteristics of the frequency bands into the ideal characteristics.

7. The method as recited in claims 5 or 6 further comprising the step of measuring the ideal characteristics of the reference frequency band when the frequency down converter is calibrated initially.

8. The method as recited in claims 5 or 6 further comprising the step of converting measurements of the calibration signal into the frequency domain as the characteristics the reference frequency and frequency bands.

9. The method as recited in claims 5 or 6 wherein the inputting step of the calibration signal for the frequency bands comprises the step of changing the center frequency of the frequency down converter.

* * * * *